US006906560B1

(12) United States Patent
Coleman, Jr. et al.

(10) Patent No.: US 6,906,560 B1
(45) Date of Patent: Jun. 14, 2005

(54) PHASE-CONTINUOUS FREQUENCY SYNTHESIZER

(75) Inventors: John Roger Coleman, Jr., Palm Bay, FL (US); Travis Sean Mashburn, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/760,990

(22) Filed: Jan. 20, 2004

(51) Int. Cl.$^7$ .............................................. H03B 21/00
(52) U.S. Cl. ....................... 327/105; 327/113; 327/355; 327/361
(58) Field of Search ................................ 327/105, 113, 327/115, 116, 355, 356, 361, 99, 298

(56) References Cited

U.S. PATENT DOCUMENTS

| | | | | |
|---|---|---|---|---|
| 4,928,315 A | * | 5/1990 | Jensen et al. | 455/307 |
| 5,343,414 A | * | 8/1994 | Asghar et al. | 708/309 |
| 5,508,661 A | * | 4/1996 | Keane et al. | 331/37 |
| 5,587,683 A | * | 12/1996 | Kawasaki et al. | 327/538 |
| 5,917,367 A | * | 6/1999 | Woo | 327/537 |
| 6,108,626 A | | 8/2000 | Cellario et al. | 704/230 |
| 6,122,223 A | * | 9/2000 | Hossack | 367/11 |

* cited by examiner

*Primary Examiner*—Timothy P. Callahan
*Assistant Examiner*—An T. Luu
(74) *Attorney, Agent, or Firm*—Allen, Dyer, Doppelt, Milbrath & Gilchrist, P.A.

(57) ABSTRACT

A digitally controlled frequency synthesizer has a first direct digital synthesizer that generates a first phase-coherent, time-varying frequency, and a second direct digital synthesizer that generates an offset frequency waveform. A plurality of cascaded frequency converters successively combine the offset frequency waveform with a reference frequency waveform to produce a plurality of waveforms having respectively different frequencies. A switch switches between the plurality of waveforms produced by the cascaded frequency converters to realize a second waveform. The operation of the second direct digital synthesizer is controlled so as to maintain phase continuity between respective ones of the plurality of waveforms contained in the second waveform as output by the switch. A mixer multiplies the first waveform by the second waveform to produce a time-varying output frequency.

16 Claims, 2 Drawing Sheets

PHASE-CONTINUOUS FREQUENCY SYNTHESIZER

FIELD OF THE INVENTION

The present invention relates in general to communication systems and subsystems therefor, and is particularly directed to a digitally controlled frequency synthesizer of the type that may be employed for relatively high frequency chirp applications, such as synthetic aperture radar (SAR) and the like, in which offset frequencies used for changing the output range of the synthesizer are controllably switched in a manner that ensures a phase continuous output sweep therebetween.

BACKGROUND OF THE INVENTION

For optimal performance, the frequency content of relatively high frequency communication signal processing systems, such as those used for generating wideband chirps for synthetic aperture radar, should be as pure as possible, in particular, they should exhibit phase continuity or coherency through the entire output frequency range. Analog synthesizer-based systems, which offer a relatively wide tuning range, suffer from arbitrary phase steps when switching between local oscillators. A direct digital synthesizer (DDS), on the other hand, provides phase continuity with low noise when switching, but is capable of operation within a relatively narrow tuning range (e.g., 100 MHz).

One technique currently used to generate a wideband chirp involves multiplying up the output chirp. of a DDS so as to realize the desired output frequency range of the system. Unfortunately, successive multiplications also multiply spurious noise by the same factor. This problem is compounded by the fact that radiation requirements customarily limit the choice of DDS to those having relatively low frequency rates, which means that even higher multiplication factors are required. Another approach, which is not necessarily acceptable, is to limit the frequency range (width) of the chirp and use receiver processing to resolve phase errors associated with the discontinuities.

SUMMARY OF THE INVENTION

In accordance with the present invention, shortcomings of conventional chirp generating systems, including those described above, are effectively obviated by a phase-continuous frequency synthesizer that is configured to ensure phase-continuity at the times of switching among a plurality of frequency sources through which the range of the chirp is defined. For this purpose, the synthesizer of the invention includes a 'fine' tune swept direct digital synthesizer (DDS) and an unswept fixed frequency offset DDS, the output of which is coupled to a set of frequency offset converters that are used to establish the overall range of the system.

The fine tune DDS is operative, under the control of a supervisory control processor to produce a linearly swept frequency output. Through a mixing operation at an upstream mixer, the frequency sweep range of the fine tune DDS is scaled or translated up to a non-octave range on the order of 1–2 GHz. This scaled up range is multiplied in a mixer by a coarse frequency step selected by a first switch to which a plurality of offset frequency ranges are supplied. The offset frequency ranges are derived from a set of cascaded frequency offset converters. Each frequency offset converter produces an output frequency that is equal to the sum of a pair of input frequencies, one of which is derived from a phase locked oscillator and the other of which is derived from the unswept offset DDS.

As will be described, under the control of a supervisory control processor, the phase of the offset frequency Foff produced by the unswept DDS is controllably adjustable in phase, so as to provide for phase-continuity at the instances of switching among the respective input frequencies to a pair of coarse frequency selection switches. In particular, the control processor sets the phase of the offset frequency Foff produced by the coarse offset DDS to be equal to the negative of overall phase delay through the lines from the offset converters to the switch terminals of the coarse frequency selection switches, so that at the instant of switching between any of their inputs, the new frequencies to which the switches transition will be at the same phase and phase continuous with the frequencies from which the switches have transitioned. The second switch has its output coupled to a multiplier the output of which is coupled to a downstream mixer which is also coupled via a bandpass filter to the output of the upstream mixer. The output of the downstream mixer -represents the output frequency produced by the synthesizer. The multiplier serves to increase the coarse frequency by a prescribed multiplication factor (e.g., times four).

In operation, whenever a transition is made to a new coarse frequency, the fine tune DDS is reset to the beginning of its sweep and thereupon proceeds to ramp over its sweep range. Upon the fine tune DDS reaching the upper end of its sweep range, the switches are controllably switched to the next offset frequency and the sweep of the fine tune DDS is restarted. At the start of the chirp, the second switch initially selects the lowest coarse frequency and remains there for one complete cycle of operation of the first switch. Once the first switch has transitioned to its high coarse frequency input, then at the next reset of the fine tune DDS, the first switch will roll over or back to its lowest frequency input. At the same time the second switch will transition from its lowest frequency input to its next lowest frequency input and so on up through its highest coarse frequency input. For each cycle through all of the coarse frequency inputs of the first switch, the second switch will point to a respective one of its inputs. Once the second switch has transitioned to its highest coarse frequency input, then on the next reset of the fine tune DDS, both switches will roll over to point to the lowest coarse thereby completing the chirp and resetting the synthesizer back to its starting frequency.

DETAILED DESCRIPTION

Figure 1:
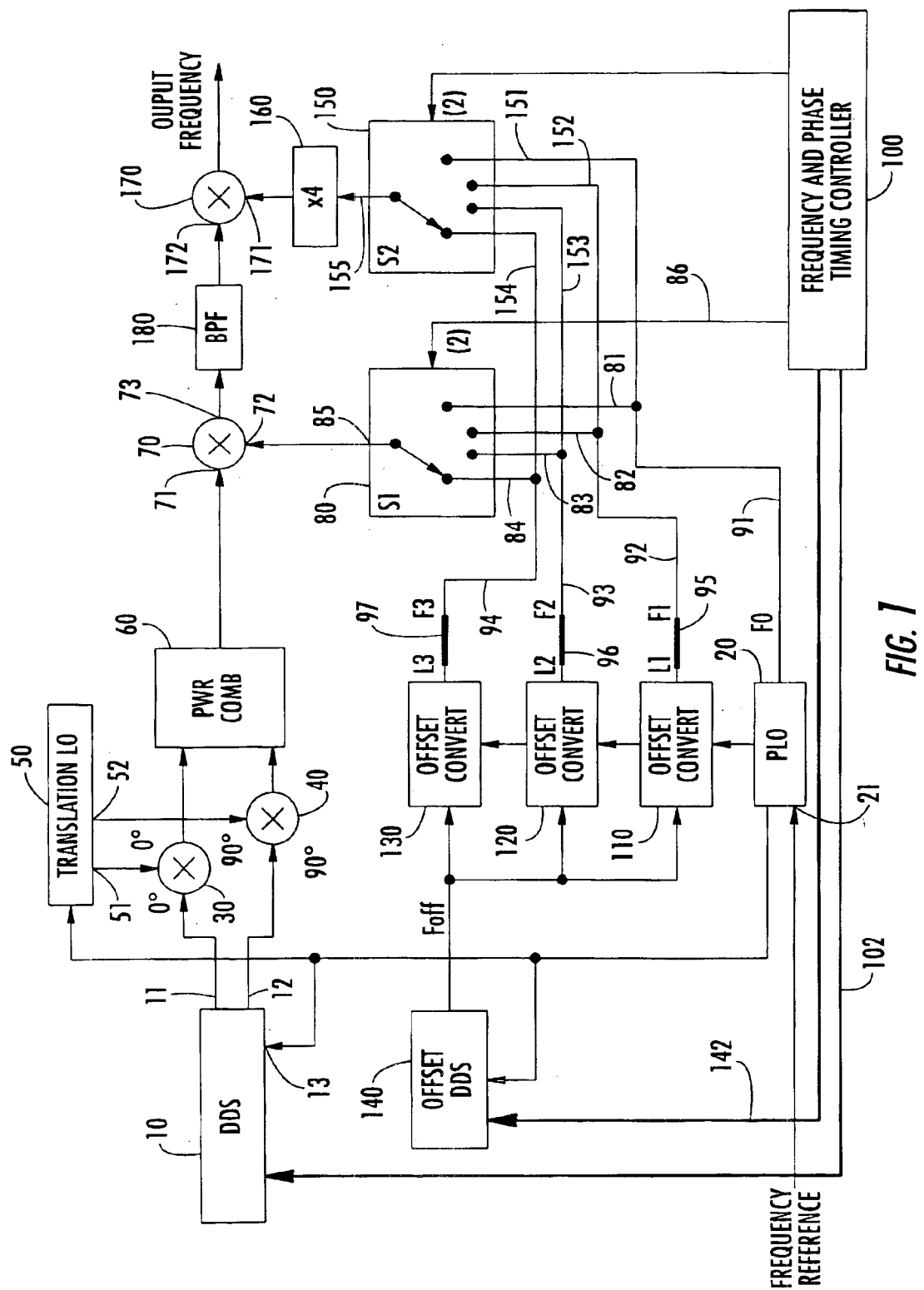
FIG. 1 diagrammatically illustrates an embodiment of a phase-continuous frequency synthesizer in accordance with the invention.

Before describing in detail the phase-continuous frequency synthesizer of the present invention, it should be observed that the invention resides primarily in a modular arrangement of conventional communication circuits and components and an attendant supervisory controller therefor, that controls the operations of such circuits and components. In a practical implementation that facilitates their being packaged in a hardware-efficient equipment configuration, this modular arrangement may be implemented by means of an application specific integrated circuit (ASIC) chip set.

Consequently, the architecture of such arrangement of circuits and components has been illustrated in the drawings by a readily understandable block diagram, which shows only those specific details that are pertinent to the present invention, so as not to obscure the disclosure with details which will be readily apparent to those skilled in the art having the benefit of the description herein. Thus, the block diagram illustration is primarily intended to show the major components of the invention in a convenient functional grouping, whereby the present invention may be more readily understood.

Attention is now directed to the FIG. 1, wherein an embodiment of the phase-continuous frequency synthesizer of the present invention is diagrammatically illustrated as comprising a controlled 'fine' tune direct digital synthesizer (DDS) 10 that is operative, under the control of a supervisory control processor 100 via a control link 102, to produce a linearly swept or ramp frequency output at respective phase-quadrature output ports 11 and 12. By 'fine' tune is meant that DDS 10 has the finest spectral granularity of various frequency tuning components of the system. As a non-limiting example, the frequency ramp produced by DDS 10 may be swept over a range of from 100 to 200 MHz. Thus the 'finest' tuning range within the system is 100 MHz.

Via a reference port 13, DDS 10 is coupled to a prescribed reference frequency (e.g., 100 MHz) produced by a phase locked oscillator (PLO) 20, an input port 21 of which is coupled to receive a frequency reference from an external source (not shown). This reference frequency is used to synchronize the various components of the synthesizer.

The phase quadrature output ports 11 and 12 of the fine tune DDS 10 are respectively coupled to in-phase (I) and quadrature-phase (Q) mixers 30 and 40, to which respective I and Q outputs 51 and 52 of a frequency translation local oscillator 50 are coupled. (Although quadrature mixing is shown, it should be observed that a simple scalar (single) mixing implementation may also be used.) Frequency translation oscillator 50 is operative to produce a relatively high radio frequency (RF) output, e.g., an RF frequency on the order of 1.0 GHz. The outputs of mixers 30 and 40 are coupled to a power combiner 60, which is configured to produce a selected (non-octave) sideband sweep of the product of the output of the translation oscillator 50 and the fine tune DDS 10 (e.g., over a range of from 1.1 GHz to 1.2 GHz).

The output of power combiner 60 is coupled to a first input 71 of frequency mixer 70, which has a second input 72 coupled to the output 85 of a first switch (S1) 80. Switch 80 is operative under processor control, via link 86 from processor 100, to switch among a plurality of coarse frequency inputs (four in the illustrated example at 81, 82, 83 and 84), that are used to define a coarse range of operation of the synthesizer (the fine tuning range of which is established by DDS 10, as described above).

For this purpose, the respective inputs 81, 82, 83 and 84 of switch 80 are coupled over links 91, 92, 93 and 94 to PLO 20 and to a set of cascaded frequency offset converters 110, 120 and 130. Each frequency offset converter produces an output frequency that is equal to the sum of its input frequencies and under the phase control of the offset frequency DDS 140. Links 92, 93 and 94 incorporate respective delay elements 95, 96 and 97, that serve to compensate for unequal line lengths to ensure phase-continuity at the instances of switching among the respective input frequencies to switch 80. PLO 20 generates a base coarse frequency F0, while the frequency offset converters 110, 120 and 130 produce respective coarse frequencies F1, F2 and F3, that are combinations of the base frequency F0 and an a coarse offset frequency Foff generated by an offset DDS 140. DDS 140 is operative under the control of a supervisory control processor 100 via a control link 142, to produce the coarse offset frequency Foff equal to the sweep range of fine tune DDS 10, which, in the present example, may be 100 MHz, as described above.

The output frequency F1 produced by frequency offset converter 110 is equal to the sum of the offset frequency Foff supplied by DDS 140 and the base frequency F0 supplied by PLO 20; the output frequency F2 produced by offset converter 120 is equal to the sum of the offset frequency Foff and the frequency F1 supplied by offset converter 110; and the output frequency F3 produced by offset converter 130 is equal to the sum of the offset frequency Foff and the frequency F2 supplied by offset converter 120. Under the control of supervisory control processor 100 via a control link 142, the phase of the offset frequency Foff produced by DDS 140 is controllably adjustable, so as to provide for phase-continuity at the instances of switching among the respective input frequencies to switch 80. In particular, control processor 100 sets the phase of the offset frequency Foff produced by offset DDS 140 to be equal to the negative of overall phase delay through the lines from the offset converters to the switch terminals of switch 80 (and also a further switch 150), so that at the instant of switching between any of its inputs the new frequency to which switch 80 switches will be at zero degrees and phase continuous with the frequency from which switch 80 has switched.

Links 91, 92, 93 and 94 are further coupled to inputs 151, 152, 153 and 154 of a second switch (S2) 150, which has its output 155 coupled to a XN (times four in the present example) multiplier 160, the output of which is coupled to a first input 171 of a mixer 170. Mixer 170 has a second input 172 thereof coupled via a bandpass filter 180 to the output 73 of upstream mixer 70. The output 173 of mixer 170 represents the output frequency produced by the synthesizer. Multiplier 160 serves to increase or step the coarse frequency supplied by the selected one of PLO 20 and the offset converters 110, 120 and 130 by a prescribed multiplication factor (times four in the present example). Thus, if frequencies F0–F3 cover a frequency range of 300 MHz, multiplier 160 increases this range to 1.2 GHz. When mixed with the output of bandpass filter 180, multiplier 160 is thereby able to effectively double the original sweep range of the chirp produced by power combiner 60. It should be noted that the invention is not limited to the use of only a single frequency multiplier switch stage, such as the multiplier stage 150. Additional multiplier switch stages may be employed for additional bandwidth expansion.

Figure 2:
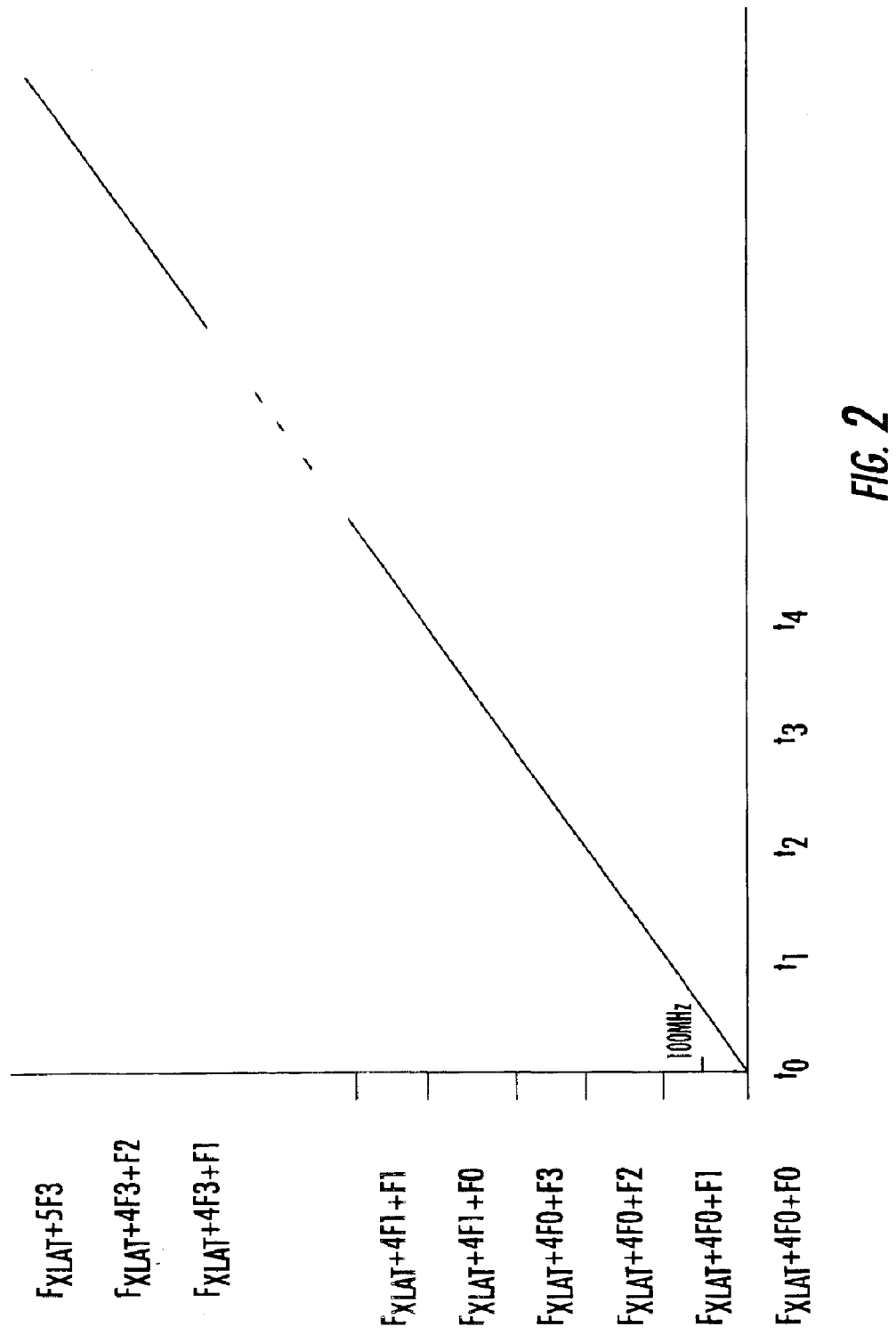
FIG. 2 is a frequency ramp timing diagram illustrating the operation of the frequency synthesizer of FIG. 1.

Operation of the frequency synthesizer of FIG. 1 will now be described with reference to the frequency chirp/ramp timing diagram of FIG. 2. For purposes of the present example, the offset frequency Foff is 100 MHz, as referenced above. At time t0, which is the beginning of the chirp, the phase of the offset frequency Foff produced by DDS 140 is controllably set at a value that will ensure phase-continuity at the instances of switching among the respective input frequencies to switches 80 and 150. Also switches 80 and 150 are coupled to receive the frequency F0 from PLO 10. As pointed out above, control processor 100 sets the phase of the offset frequency Foff produced by offset DDS 140 to be equal to the negative value of overall phase delay through the lines from the offset converters to the switches, so that at the instant of switching between any of their inputs the new frequencies to which switches 80 transition will be at zero degrees and phase continuous with the previous frequency. (It is to be understood that by phase is meant the relative difference between the pre-switched frequency and the post-switched frequency at the instant of switching, i.e., zero degrees difference and phase continuous.) Whenever a transition is made to a new coarse frequency, the fine tune DDS is reset to the beginning of its sweep and thereupon proceeds to ramp over its sweep range (100 MHz in the present example). Upon DDS 10 reaching the upper end of its sweep range, switch 80 switches to the next offset frequency F1 following F0 and the sweep of DDS 10 is restarted.

Switch 150 is initially set at the F0 output of PLO 20 and remains there for one complete cycle of operation of switch 80, as the latter sequentially transitions through its coarse frequency inputs 81-82-83-84. Therefore, as shown in FIG. 2, at time t0, the output of the synthesizer is equal to the product of the translation frequency output (Fxlat) of power combiner 60 plus the lowest coarse frequency F0, plus N=4 times the reference frequency F0. Between time t0 and time t1, as the frequency output of the fine tune DDS 10 ramps over its 100 Mhz range, the output of the synthesizer is linearly swept from Fxlat+F0+4F0 to Fxlat+F0+4F0+Foff which equals Fxlat+F1+4F0. Upon reaching the frequency Fxlat+F0+4F0+Foff at time, fine tune DDS 10 returns to the base translation frequency Fxlat. However, since switch 80 is switched from input 81 to input 82, the output of the synthesizer begins sweeping from Fxlat+4F0+F1 to Fxlat+4F0+F1+Foff, and so on as the switch 80 is stepped through its additional inputs 83 and 84.

Once switch 80 has transitioned to its highest coarse frequency input 84, then, on the next reset of DDS 10, switch 80 will roll over or back to its lowest coarse frequency input 81. At the same time switch 150 will transition from its lowest coarse frequency (4F0) input 151 to its second lowest coarse frequency (4F1) input 152 and remain there for another complete cycle of switch 80. Namely, for each successive cycle through all four inputs of switch 80, switch 150 will point to a respective one of its inputs to provide 4F0, 4F1, 4F2 and 4F3. Once switch 150 has transitioned to its highest coarse frequency (4F3) input 154, then on the next reset of DDS 10, as switch 80 rolls over to its input 81, switch 150 will roll back to its input 151. its second input 152 and so on through input 154, thereby completing the chirp and resetting the synthesizer back to its starting frequency.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A method of generating a varying frequency waveform comprising the steps of:
   (a) generating a first waveform having a time-varying frequency;
   (b) generating a second waveform by switching between respective ones of a plurality of waveforms having respectively different frequencies in a manner that maintains phase continuity between said respective ones of said plurality of waveforms contained in said second waveform; and
   (c) combining said first waveform with said second waveform to produce said varying frequency waveform.

2. The method according to claim 1, wherein generating said second waveform comprises generating an offset frequency waveform and successively combining said offset frequency waveform with a reference frequency waveform to produce said plurality of waveforms having said respectively different frequencies.

3. The method according to claim 1, wherein generating said first waveform comprises controlling the operation of a first digital synthesizer and translating the output of said first digital synthesizer to generate said first waveform, and wherein generating said second waveform comprises generating said offset frequency waveform by means of a second digital synthesizer, successively combining said offset frequency waveform with a reference frequency waveform to produce said plurality of waveforms having said respectively different frequencies, and controlling the operation of said second digital synthesizer in a manner that maintains phase continuity between said respective ones of said plurality of waveforms contained in said second waveform.

4. The method according to claim 3, wherein generating said second waveform comprises controlling the operation of said second digital synthesizer so that said offset frequency generated thereby has a prescribed phase that causes said respective ones of said plurality of waveforms, when switched into said second waveform to have phase continuity, at the time of switching.

5. The method according to claim 1, further including the step (d) of translating the frequency range of said second waveform to produce a third waveform and combining said third waveform with said varying frequency waveform to produce a varying frequency output waveform.

6. The method according to claim 1, wherein generating said second waveform comprises the steps of:
   (b1) cascading a plurality of frequency converters to the output of a reference frequency waveform generator; and
   (b2) coupling an offset frequency waveform to said plurality of frequency converters, so as to cause said plurality of frequency converters to successively combine said offset frequency waveform with said reference frequency waveform to produce said plurality of waveforms having said respectively different frequencies.

7. An apparatus for generating a varying frequency waveform comprising:
   a first waveform generator that is operative to generate a first waveform having a time-varying frequency;
   a second waveform generator that is operative to generate a second waveform by switching between respective ones of a plurality of waveforms having respectively different frequencies in a manner that maintains phase continuity between said respective ones of said plurality of waveforms contained in said second waveform; and
   a mixer that is operative to multiply said first waveform by said second waveform to produce said varying frequency waveform.

8. The apparatus method according to claim 7, wherein said second waveform generator is operative to generate an offset frequency waveform and to successively combine said offset frequency waveform with a reference frequency waveform to produce said plurality of waveforms having said respectively different frequencies.

9. The apparatus according to claim 7, wherein said first waveform generator comprises a first digital synthesizer and a translator that is operative to translate the output of said first digital synthesizer to generate said first waveform, and wherein said second waveform generator comprises a second digital synthesizer that is operative to generate said offset frequency, and a plurality of cascaded frequency converters that are operative to successively combine said offset frequency waveform with a reference frequency waveform to produce said plurality of waveforms having said respectively different frequencies, and a controller for controlling the operation of said second digital synthesizer in a manner that maintains phase continuity between said respective ones of said plurality of waveforms contained in said second waveform.

10. The apparatus according to claim 9, wherein said controller is operative to control the operation of said second digital synthesizer so that said offset frequency generated thereby has a prescribed phase that causes said respective ones of said plurality of waveforms, when switched into said second waveform, to have phase continuity at the time of switching.

11. The apparatus according to claim 7, further including a multiplier to which said second waveform is coupled to produce a third waveform and an output combiner which is operative to combine said third waveform with said varying frequency waveform to produce a varying frequency output waveform.

12. The apparatus according to claim 7, wherein said second waveform generator comprises at least one frequency converter coupled in cascade with the output of a reference frequency waveform generator and an offset frequency waveform generator which is operative to supply an offset frequency waveform to said at least one frequency converter, so as to cause said at least one frequency converter to combine said offset frequency waveform with said reference frequency waveform to produce said plurality of waveforms having said respectively different frequencies.

13. An apparatus for generating a varying frequency waveform comprising:

a first direct digital synthesizer that is operative to generate a first phase-coherent waveform having a time-varying frequency;

a second direct digital synthesizer that is operative to generate an offset frequency waveform;

a reference frequency waveform generator that is operative to generate a reference frequency waveform;

a plurality of cascaded frequency converters that are operative to successively combine said offset frequency waveform with said reference frequency waveform to produce a plurality of waveforms having respectively different frequencies;

a switch that is operative to switch between said plurality of waveforms produced by said plurality of cascaded frequency converters to realize a second waveform;

a controller for controlling the operation of said second direct digital synthesizer in a manner that maintains phase continuity between said respective ones of said plurality of waveforms contained in said second waveform as realized by said switch; and a mixer that is operative to multiply said first waveform by said second waveform to produce said varying frequency waveform.

14. The apparatus according to claim 13, wherein said controller is operative to control the operation of said second direct digital synthesizer so that said offset frequency generated thereby has a prescribed phase that causes said respective ones of said plurality of waveforms, when switched into said second waveform by said switch, to have phase continuity at the time of switching.

15. The apparatus according to claim 13, further including delay elements coupled between said plurality of cascaded frequency converters and said switch, and being operative to delay said respective ones of said plurality of waveforms, so that when switched into said second waveform, new frequencies to which switch transitions will be phase continuous with the frequencies from which said switch has transitioned.

16. The apparatus according to claim 13, further including a frequency for translating the frequency range of said second waveform to produce a third waveform and to combine said third waveform with said varying frequency waveform to produce a varying frequency output waveform.

* * * * *